United States Patent [19]
Reis et al.

[11] Patent Number: 5,536,342
[45] Date of Patent: Jul. 16, 1996

[54] AUTOMATED GASKET APPLICATOR AND METHOD OF USING SAME

[75] Inventors: Bradley E. Reis, Wilmington; Allan D. Pincus, Newark, both of Del.; William G. Lytle, New London, Pa.; Robert C. Rudolph, Elkton, Md.; Charles R. Geese, Newark, Del.; Keith D. Adkins, Elkton, Md.

[73] Assignee: W. L. Gore & Associates, Inc., Newark, Del.

[21] Appl. No.: 215,124

[22] Filed: Mar. 18, 1994

[51] Int. Cl.⁶ .................................................. B32B 31/00
[52] U.S. Cl. ........................ 156/64; 156/353; 156/361; 156/517; 156/540; 156/265
[58] Field of Search ................ 156/64, 350, 353, 156/358, 361, 362, 540, 256, 264, 265, 517, 519, 521

[56] References Cited

U.S. PATENT DOCUMENTS

| | | | |
|---|---|---|---|
| 4,255,218 | 3/1981 | Stageberg | 156/540 X |
| 4,448,626 | 5/1984 | Off et al. | 156/353 X |
| 4,548,493 | 10/1985 | Mayfield | 355/125 |
| 4,557,790 | 12/1985 | Wisbey | 156/519 X |
| 4,588,466 | 5/1986 | Eaton | 156/540 X |
| 4,591,402 | 5/1986 | Evans et al. | 156/353 X |
| 4,636,276 | 1/1987 | Nozaka | 156/353 |
| 4,759,810 | 7/1988 | Jackson et al. | 156/64 |
| 4,759,962 | 7/1988 | Buecken et al. | 428/41 |
| 4,898,638 | 2/1990 | Lugez | 156/272.6 |
| 4,978,417 | 12/1990 | Grimshaw et al. | 156/353 X |
| 5,011,563 | 4/1991 | Shinno et al. | 156/353 X |
| 5,032,211 | 7/1991 | Shinno et al. | 156/361 |
| 5,106,450 | 4/1992 | Freisitzer et al. | 156/517 |
| 5,261,996 | 11/1993 | Rossini | 156/521 |

Primary Examiner—David A. Simmons
Assistant Examiner—Paul M. Rivard
Attorney, Agent, or Firm—Victor M. Genco, Jr.

[57] ABSTRACT

A method and apparatus for applying a gasket strip to a substrate. An application head guided by a controlled robot applies the gasket strip to the substrate and cuts the strips to the desired length as they are applied. The application head applies as many strips in as many positions as necessary to form the desired gasket pattern.

40 Claims, 6 Drawing Sheets

AUTOMATED GASKET APPLICATOR AND METHOD OF USING SAME

BACKGROUND OF THE INVENTION

1. Field of the Invention

The present invention pertains to a method and apparatus for applying gasket strips to a surface. More particularly, the invention relates to an automated system using a robot guided head to manufacture gasket patterns, and is particularly suitable for applying gasket strips to circuit boards, covers, fixtures, cases components, etc.

2. Description of the Related Art

Electronic circuit boards may require some type of shielding to prevent interference from electromagnetic signals. The shielding can protect the circuits on a circuit board from signals generated from sources outside the circuit board, or protect components and circuits outside the circuit board from signals generated on the board itself. It may also be desirable to shield components and circuits on one part of the circuit board from components and circuits on another part of the same circuit board.

Shielding to prevent interference can be provided by applying an Electro-Magnetic Interference (EMI) shielding gasket to the circuit board. The gasket material usually has conductive characteristics to act as an effective shield against electromagnetic signals. Surrounding the component where the interference must be shielded, the gasket is typically compressed between the circuit board and a metal cover or case.

There are presently only a few methods of applying a shielding gasket to a circuit board, cover, or case. The first utilizes a molded gasket of the desired shape which is either glued in place, pressed onto a ridge (like a saddle), pressed onto a groove or channel, or uses the circuit board bolts to keep from shifting during use. Another method uses die-cut gasket patterns, but this is very expensive due to the high material waste. Additionally, both of these methods are extremely labor intensive, costly to redesign, and thus unpopular. They also limit the designer because changes to a design mid-production can be extremely costly.

Another method for shielding circuits is to place beryllium copper clips or pegs onto a cover that makes contact with the circuit board. These, however, are labor intensive, costly to redesign, and difficult to put on. An innovative method of applying gasket material that eliminates these shortcomings is desirable.

Gasket strips are also used in other industries. For example, automotive gaskets are used for sealing various engine parts to maintain gas and liquids, and in areas such as windshields to seal the environment from the car's interior. One device as disclosed in U.S. Pat. No. 4,759,810 to Jackson et al. applies precut lengths of gasket strips to a windshield. Because the gasket material must be precut, and an operator must load precut rolls of gasket in the device, it is not easily adaptable to different gasket patterns. Moreover, the device lays down a one piece continuous length of gasket to form the entire gasket pattern. This is not suitable for making complicated gasket patterns that may require many individual strips.

Accordingly, one object of the present invention is to provide a method and apparatus for applying gaskets that is less labor intensive.

Another object is to provide a method and apparatus for applying gaskets that is less expensive.

A further object of the invention is to provide a method and apparatus for applying gaskets that minimizes the gasket material required.

Another object of the invention is to provide an automated method and apparatus for forming complicated patterns of gasket strips.

Another object is to provide an automated method and apparatus capable of making different patterns of gaskets.

Additional objects, advantages and novel features of the invention will be set forth in part in the description which follows, and in part will become apparent to those skilled in the art upon examination of the following or may be learned by practice of the invention. The objects and advantages of the invention can be realized and attained by the method and apparatuses particularly pointed out in the appended claims.

DESCRIPTION OF THE DRAWINGS

The foregoing summary, as well as the following detailed description, will be better understood when read in conjunction with the drawings appended hereto. For the purpose of illustrating the invention, there is shown in the drawings several embodiments. It is understood, however, that this invention is not limited to the precise arrangement and instrumentation shown.

SUMMARY OF THE INVENTION

The present invention provides a unique automated method and apparatus for applying gasket strips to a substrate, such as a circuit board, to form gasket patterns.

Broadly, the present invention directs a robot with a controller to apply the gasket strip to the substrate. The robot is then moved to advance a length of strip onto the substrate, the advancing strip being guided onto the substrate in the desired position. The controller actuates the cutting of the strip to the desired length. These steps can be repeated to apply additional strips as necessary to form the desired gasket pattern.

Broadly, the present invention further provides an apparatus having a robot for controlling the position of the gasket strip relative to the substrate. A controller directs the robot. An application head, attached to the robot, has an application shoe for applying the strip to the substrate. A cutting assembly attached to the application head cuts the strip to the desired length.

DETAILED DESCRIPTION OF THE INVENTION

The invention disclosed herein is a novel automated method and apparatus for applying strips of material to a substrate, a substrate being any surface for receiving strips of material. The embodiments described below are particularly suited for applying strips of EMI gasket material to a substrate to create a gasket pattern. In this case, the substrate can be the circuit board itself, or a transfer carrier which is then used to transfer the completed gasket pattern onto the circuit board or the shield cover. It is understood, however, that the present invention can be adapted to apply other types of strip material to other types of substrates.

Reference now will be made in detail to the presently preferred embodiments of the invention, examples of which are illustrated in the accompanying drawings. Each of the embodiments described herein are similar in function and structure and are best understood when viewed in conjunction with the other embodiments.

FIGS. 1, 2, 3, and 4 show the present invention incorporated in a gasket application device 10 for applying a gasket strip 12 directly to a circuit board 14. The circuit board 14 is supported securely on a work surface 16. As will be illustrated, the device applies as many lengths of gasket strips, in as many locations as required, to create the final gasket pattern.

Figure 1:
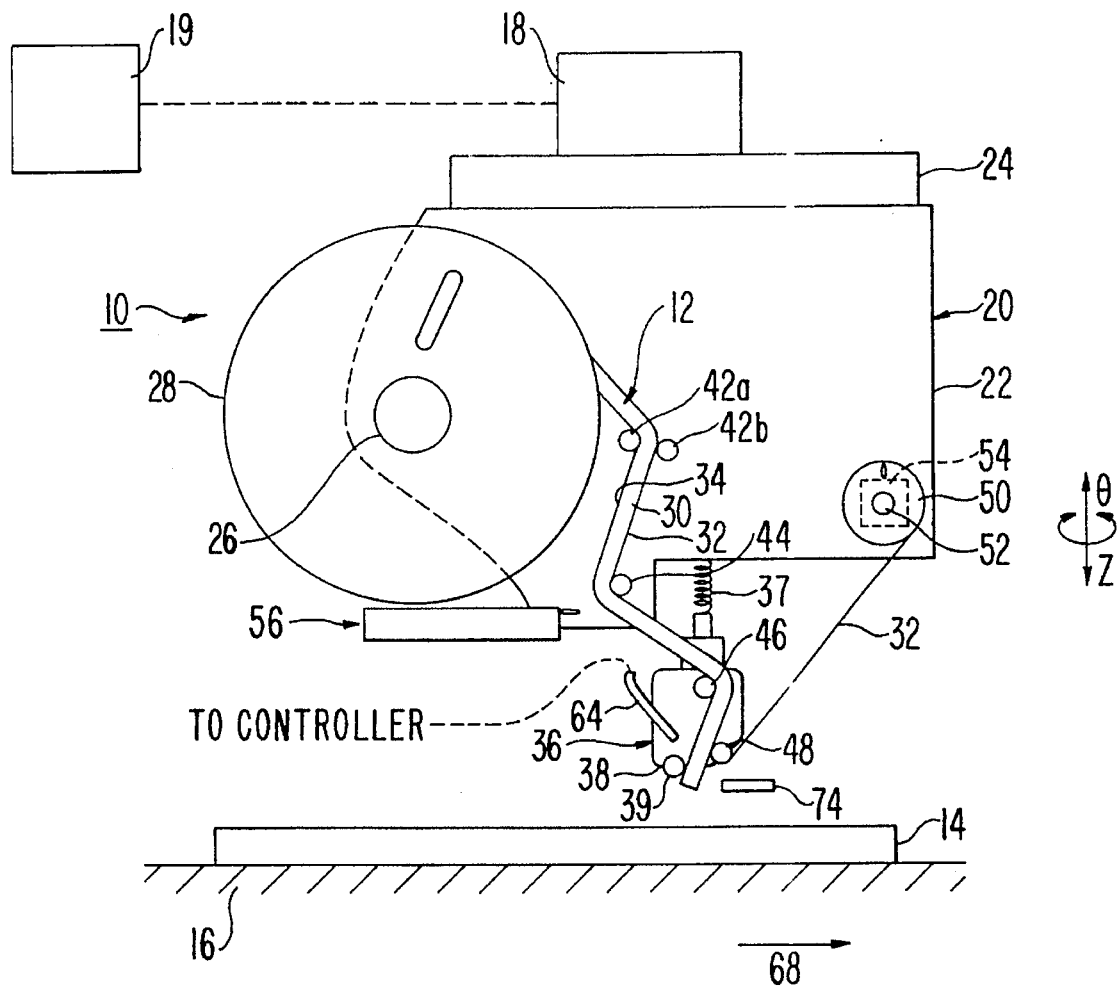
FIG. 1 is an elevational view of a gasket device for applying gasket strips directly to a circuit board.

As seen in FIG. 1, the gasket application device 10 has a controllable gantry 18. The robot can be any type of suitable robot arm or gantry capable of movement in multiple dimensions, preferably in the horizontal X and Y axes, and the vertical Z axis, relative to the work surface 16. Movement in the horizontal rotary axis is also desirable. A preferred robot for the present embodiment is a gantry style robot, such as those available from several manufacturers, one being Techno-Isel located in New Hyde Park, N.Y.

Directing the movement of gantry 18 to create the desired gasket pattern is a programmable controller 19. The gasket pattern is programmed into the controller, which then directs the various movements and functions of the device to lay the strips of gasket material onto the substrate. Such devices may include various commercially available devices, such as microprocessors, digital computers, and other control apparatus.

An application head 20 is adapted to removably attach to and be moved by the gantry 18 as directed by the controller 19. Attached to the application head 20 are the necessary items and equipment to support and guide the gasket strip to the substrate for the specific application, i.e., applying gasket strips directly to a circuit board. As is explained below, different type application heads can be attached to the gantry 18 for different type applications.

The application head 20 has a mounting frame 22 used as a platform for supporting the other items including the gasket strip 12 to be applied. It is preferably made out of metal for strength and rigidity, such as a simple flat piece of aluminum, although any suitable material can be used. The head 20 can attach directly to the gantry 18, or by an adapter plate 24 as shown.

A payoff spool hub 26 is rotatably attached to the mounting frame 22. It is designed for holding a payoff spool 28 of gasket material, and is preferably made of plastic such as Delrin®, a trademark of E. I. dupont de Nemours, Inc. of Wilmington, Del., to minimize weight. The hub 26 may have spring-loaded ball plungers allowing the spool 28 to snap on and off. It is preferable that the spool 28 not freely spin as the gasket strip advances, although a free spinning spool may be useful in different applications. Thus, the hub 26 spins on a mechanical adjustable clutch mechanism that tensions the hub 26 and prevents free spinning. Such clutches are readily available from companies such as Custom Products of North Haven, Conn.

An alternate method of tensioning the hub 26 is to connect the hub to a direct current motor wired to rotate the hub in a direction opposite the direction the hub rotates when letting out gasket material. Keeping the voltage low prevents the hub from actually rotating in reverse, but does apply enough back-tension to prevent free spinning.

The spool 28 holds a continuous wound length of gasket strip 12. The spool can be a single row pancake-style spool, or the type having several level wound rows of gasket strip to achieve longer lengths. The spool 28 is also preferably made of plastic or other relatively strong and light material to minimize weight. For this particular embodiment, one side 30 of the gasket strip has an adhesive for permanently adhering to the circuit board. A release backer strip 32 covers the adhesive side 30 to prevent the gasket strip from sticking to itself in the spool. A suitable type of release backer is a polymer strip, such as MYLAR polymer available from E. I. dupont de Nemours and Company, having a silicon release coating to permit easy removal from the adhesive. A second side 34 of the gasket strip contains no adhesive.

Attached to the bottom of the mounting frame 22 is a floating head 36, which can move up and down relative to the frame 22. A compression spring 37 or similar device provides a biasing force downwards to return the floating head 36 to its normal position after the floating head 36 has moved.

An application shoe 38 applies or lays down the gasket strip 12 onto the circuit board 14 and is positioned on the bottom of the floating head 36. In the present embodiment, the shoe 38 comprises a shouldered application idler roller 39, the shoulders adapted for the size of the particular gasket strip being used. The idler roller 39 rotates freely on the gasket strip 12 as the strip is advanced and laid onto the circuit board 14. It is understood that the idler roller can comprise a wheel or similar device capable of guiding or laying down the strip material onto the substrate.

In the illustrated embodiment of the present invention, the gasket strip advancing from the payoff spool 28 to the application idler roller 39 is guided by double idler rollers 42a, 42b, cutting idler roller 44, idler roller 46 on the top of the floating head 36, and take up idler roller 48. These idler rollers are preferably free spinning and "shouldered" to maintain proper gasket strip alignment.

Figure 3:
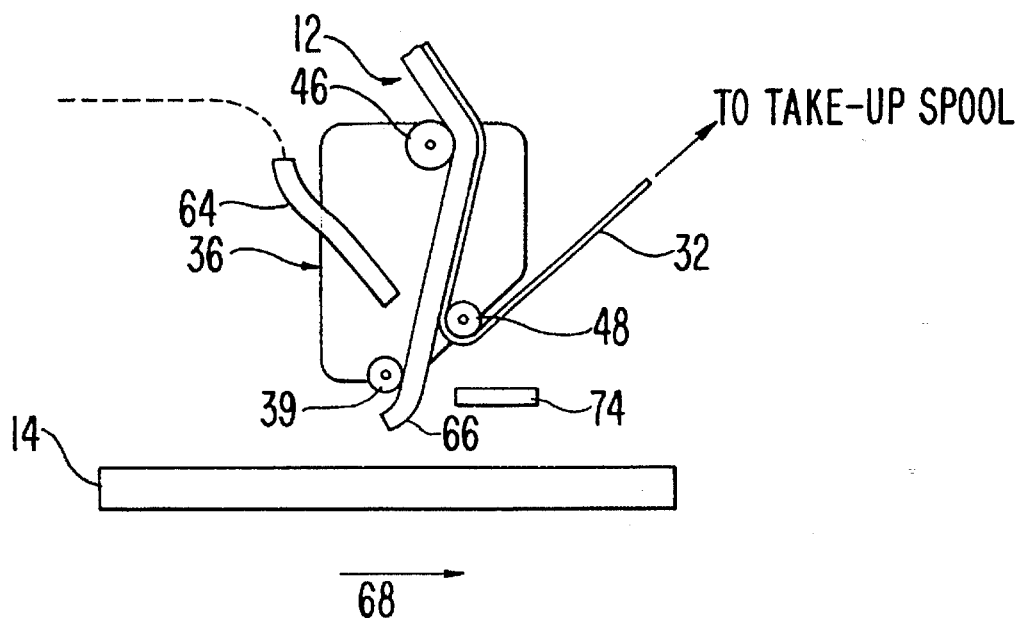
FIG. 3 is an enlarged view of the floating head shown in FIG. 1.
Figure 4:
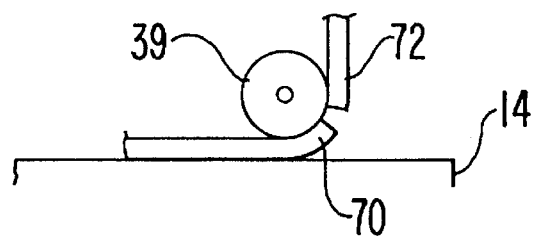
FIG. 4 is an enlarged view of gasket material of FIG. 1 applied to the circuit board.

As is more clearly seen in FIGS. 1 and 3, the release backing 32 is peeled from the gasket strip 12 as it advances past the take up idler roller 48. A take-up spool 50, snapped onto take up hub 52, rotates to collect the release-backer 32. Both the take-up spool 50 and hub 52 are preferably made of plastic or similar lightweight material.

The take-up hub 52 is driven by a motor 54 for rotating the spool 50. Preferably, the motor is a direct current (DC) motor controlled from a variable DC power supply to control the torque, and hence, the peeling strength of the motor for peeling the release backer 32 from the gasket strip 12. The voltage should normally be set so that the peeling strength is high enough to peel the release backing at idler roller 48, but not high enough to overcome the tension in hub 26 preventing the free spinning of payoff spool 28. Other type motors can be used, such as a stepper motor controlled by the controller 19 which can be moved the precise amount necessary to take up the release backer 32.

Figure 2:
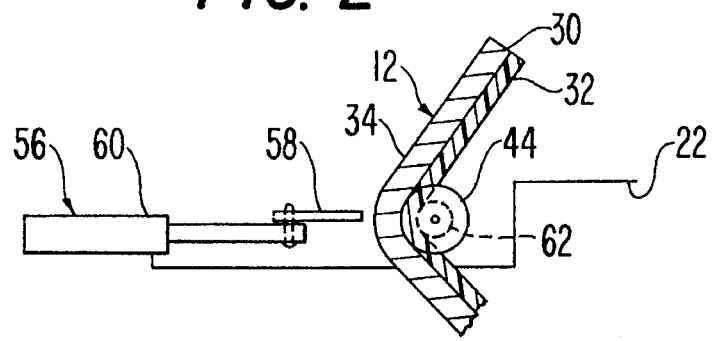
FIG. 2 is an enlarged view of the cutting mechanism shown in FIG. 1.

Referring to FIGS. 1 and 2, the cutting assembly 56 is mounted on the application head 20 to cut the gasket strip 28 to the desired length. The assembly 56 has a cutting blade 58 attached to a pneumatic cylinder 60 that moves the blade into the gasket strip when actuated by the programmable controller 19. The blade 58 cuts the gasket strip 12 against the cutting idler roller 44 which is "shouldered" (i.e., has a channel 62 formed to the thickness of the release strip). The blade 58, wider than the shouldered channel, cuts only to the shoulder, cutting the gasket strip 12, but not the release backer 32.

A sensor 64 is shown positioned along the path of the gasket strip 12 between the take-up idler roller 48 and the application idler roller 39. The sensor provides feedback to the controller 19 as to whether or not it detects a gasket strip 12. Any suitable sensor may be used, an optical sensor that registers gasket strip, but not the release backer being preferable. Upon detecting the absence of a gasket strip, the controller causes the strip to advance to the application idler roller 39. This function will be further described below.

Having described the structural elements of the present embodiment, its operation is now described with reference to FIGS. 1, 2, 3 and 4. A continuous length of EMI gasket strip 12 in the payoff spool 28 is advanced through the guide idler rollers to the application idler roller 39 as shown. The release backer 32 is peeled off at the take-up idler roller 48 and collected by the take up spool 50. Before laying down a gasket strip 12 to the circuit board 14, a beginning lead end 66 of gasket strip 12 is positioned just below the application idler roller 39.

The controller 19 positions the gantry 18 in the proper alignment and location for applying the next strip of gasket 12. The application head 20 is moved downward until the application idler roller 39 presses a lead end 66 on to the circuit board 14. The application head is then moved horizontally in the desired direction to "roll out" or "lay down" an advancing strip of gasket material past the idler roller onto the circuit board. It is understood that the application head 20 must be oriented as shown to lay out a gasket strip in direction 68. Because the gasket strip strongly adheres to the circuit board 14, additional gasket strip is pulled from the payoff spool 28.

Controller 19 actuates the cutting mechanism 56 at the appropriate position. Determining the length of gasket strip applied, the controller causes the blade 58 to move into cutting idler roller 44 at the appropriate position to cut the strip. The application head continues to move until the complete length of gasket strip is rolled out onto the circuit board, its end 70 applied, with a new lead end 72 in position for the next application. The application head 20 is then lifted away from the circuit board and realigned and repositioned to apply the next strip of material. This process is repeated until the desired gasket pattern is applied.

As shown in FIG. 3, a beginning lead end 66 curved under the application idler roller 39 is necessary to begin each gasket strip application. It has been found that the clockwise bending of the gasket strip 12 around the idler roller 46 biases the strip to curve in the clockwise direction. Thus, once released from the release backing 32, the cut lead end 66 curves under the idler roller 39 as shown. If necessary, a small air nozzle 74 can direct air to push the lead end 66 under the application idler roller 39.

It may also be necessary to advance the lead end 66 a sufficient distance to reach under the application idler roller 39. After a previous strip has been applied to the substrate, the lead end of the next strip may not advance to the application idler roller. When the sensor 64 fails to detect gasket material between the take-up and application idler rollers 39 and 48, respectively, the controller 19 causes the take up motor to rotate the take-up spool 50, pulling the release backer 32, and thereby advancing the gasket material. If the take-up motor is a DC motor, this is done by increasing the voltage to overcome the tension on the application hub 26 until the sensor 64 detects the gasket strip. It then switches back to lower voltage to maintain tension in the system.

The gasket is advanced, however, only to the point where the sensor detects it. The strip must be further advanced the small distance between the point of detection by the sensor and the point below the application idler roller 39 necessary for starting a new application of gasket strip.

One method of doing so is to decrease the distance between the frame 22 and the floating head 36 a predetermined amount, and then returning both to their normal position. For example, the controller can move the application head 20 downward onto the substrate 14 to compress spring 37 a predetermined amount. It is seen that as the distance between the frame 22 and the floating head 36 decreases, slack is created in the entire length of gasket strip 12 and release backer 32 between the payoff spool 28 and the take-up spool 50. This slack is immediately taken up by the DC motor driven take up spool 50, thereby advancing the lead end 66 downward. When the application head 20 is returned to its normal position (i.e., increasing the distance between the frame 22 and floating head 36), the additional strip needed to make up this distance is pulled from payoff spool 28 by the take-up spool 50, which cannot rotate in reverse to give back any amount of release backer strip.

As an alternative, if the take up motor is a stepper motor, the controller simply advances the motor the predetermined amount to position the lead end 66 below the application idler roller 39.

The invention is thus capable of forming extremely complicated gasket patterns in a very short period of time. Different patterns can be created with a simple software program. The entire process leaves straight lengths of gasket to form a gasket pattern on a workpiece. Curves, including complete circles, may be made as well by simply rotating the gantry about its θ axis in conjunction with movement in the X and Y axes while laying down the gasket strip. This process may be facilitated by modifying the application idler roller 39 by splitting it down its center to allow for independent movement of each of its edges.

A second embodiment incorporating the present invention is now described with reference to FIGS. 5, 6 and 7. Unlike the first embodiment, which applies the gasket strips directly to a circuit board, this embodiment applies the gasket strip first to an intermediate transfer substrate or carrier. Once the completed gasket pattern is formed on the carrier, the carrier is used to transfer the gasket to a circuit board, cover, or other substrate. This embodiment incorporates similar parts and elements as described in the other embodiment, and is readily understood when read in conjunction with them.

Figure 7:
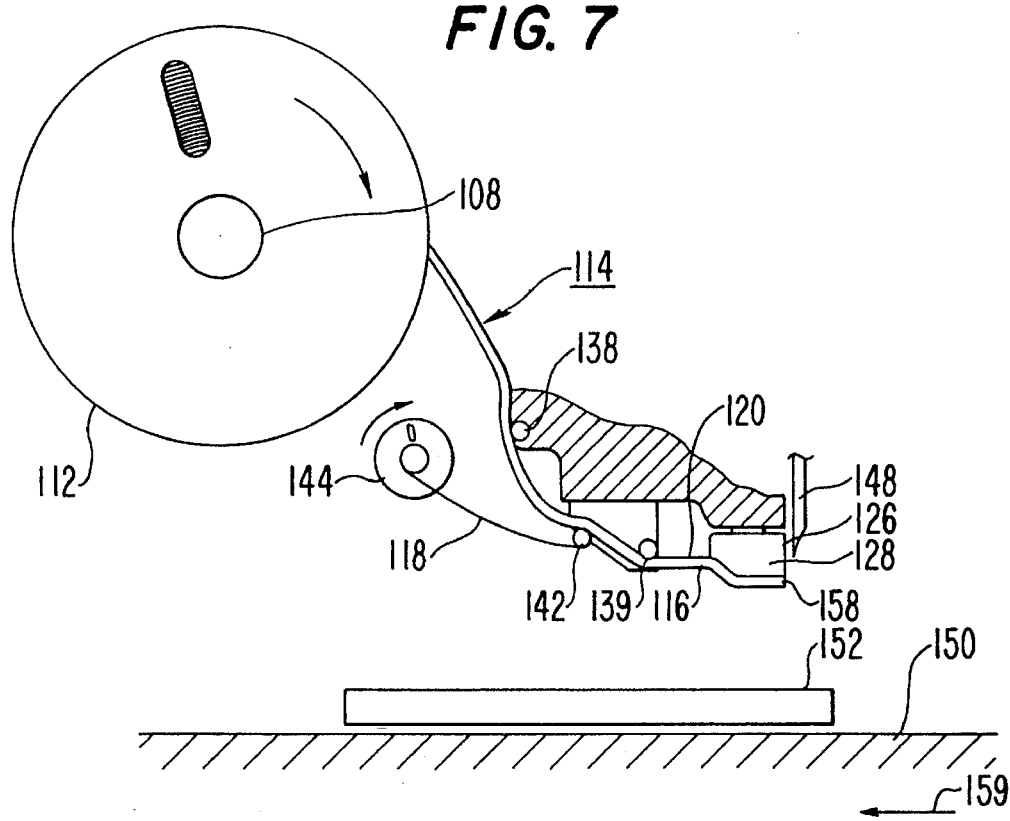
FIG. 7 is a schematic view showing the path of the gasket strip through the device shown in FIG. 5.

Shown in FIGS. 5A, 5B, and 7 is an application head 100 which is movable in the X, Y, Z, and θ directions by gantry 102, as directed by controller 104. The application head 100 has a frame 106, and an adapter plate 107 for removably attaching to the gantry 102.

A payoff spool hub 108 is rotatably attached to the frame 106 by frame arm 110, and is adapted to hold a payoff spool 112 of wound gasket strip 114. A tensioning clutch mechanism prevents the hub 108 from free spinning.

As with the first embodiment, gasket strip 114 is a gasket material having an adhesive side 116 covered by a release backing 118, and a non adhesive side 120.

Attached to the bottom of the frame 106 is the floating head 122. Mounted to the frame 106 on a slide assembly 124, the floating head 122 is free to move up and down relative to the frame 106, it being biased by gravity, however, to its bottom most position. The slide assembly 124 shown comprises a linear bearing, although any suitable slide assembly may be used.

Figure 5:
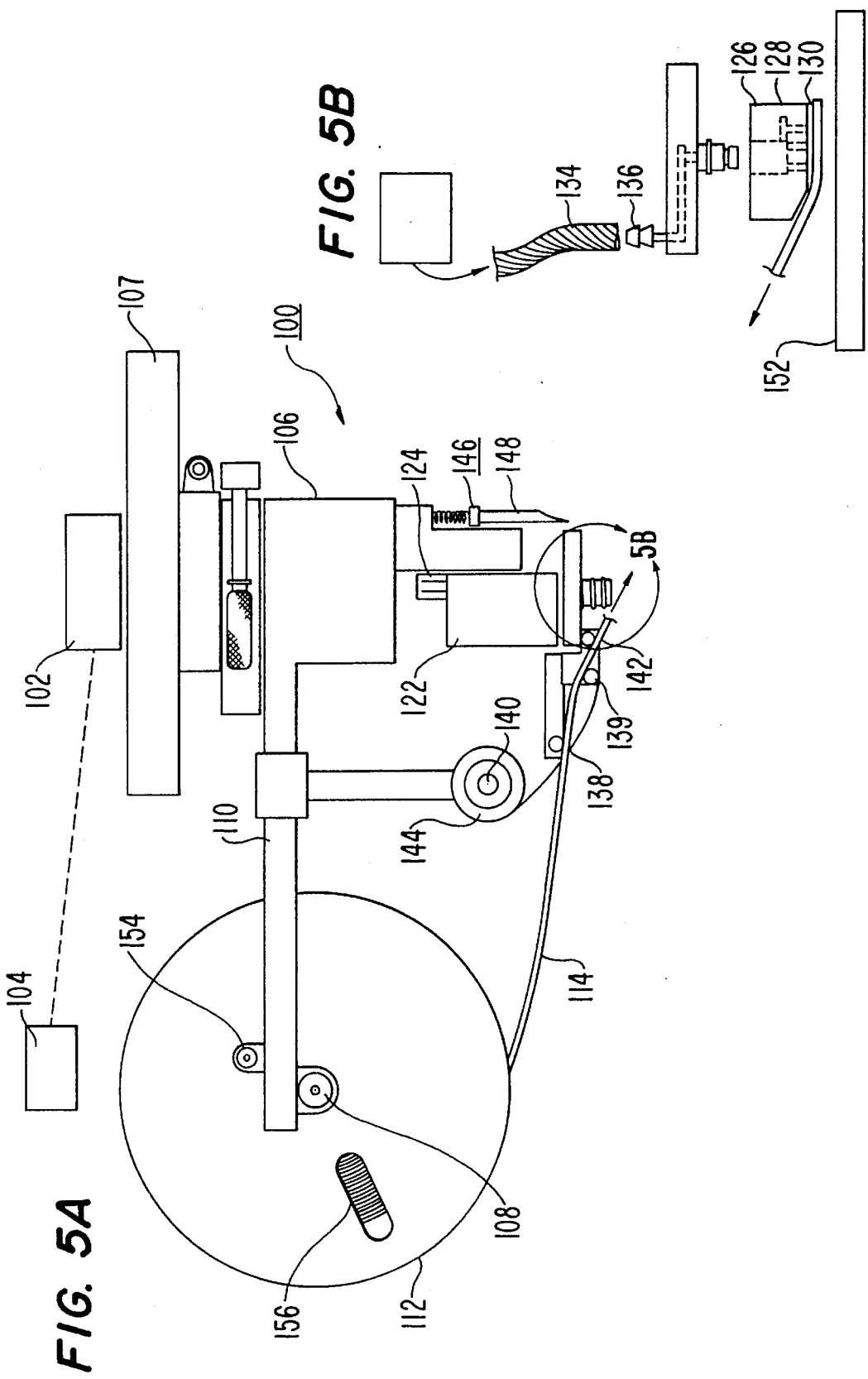
FIG. 5A is an exploded view of a gasket device for applying gasket strips to a transfer substrate.
FIG. 5B is an enlarged view of an application shoe shown in FIG. 5A.
Figure 6:
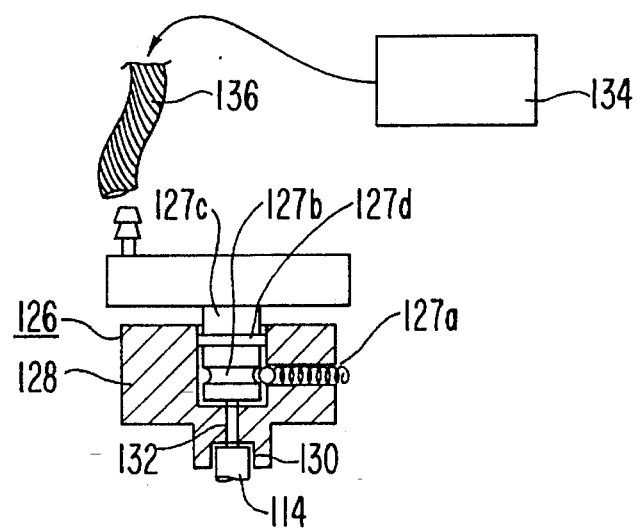
FIG. 6 is a schematic frontal view of the vacuum shoe in FIG. 5.

With further reference to FIGS. 5B and 6, the application shoe 126 is fixed to the bottom of the floating head 122. The application shoe may be held in place through use of any suitable mechanism, such as a spring-loaded ball plunger 127a that mounts into an inside detent hole or groove 127b on vacuum post 127c. An O-ring 127d is provided on the post 127c to prevent vacuum loss. In the present embodiment, the shoe 126 comprises a vacuum shoe 128 having a channel 130 cut wide and deep enough to accommodate the gasket strip 114. Located in the top of the channel 130 are small openings 132 connected to a vacuum system 134 through a vacuum air hose 136. A vacuum is applied to keep the gasket strip 114 secured within the shoe 126 when the strip is not being applied, and released to allow the gasket strip to travel through the channel 130 when the gasket strip 114 is being applied to the substrate 152. Air may be blown through the vacuum holes 132 when the vacuum is off to help the gasket strip slide through the channel on a layer of air.

The guide for the gasket strip 114 between the payoff spool 112 and the vacuum shoe 128 comprises upper idler roller 138, a lower idler roller 139, and a take-up idler roller 142. These idler rollers are preferably free spinning and shouldered.

The take-up spool 144, removably mounted on the take-up hub 140, collects the release backer 118 peeled at take-up idler roller 142. The hub 140 preferably has a motor, such as a DC or stepper type, to drive the take-up spool 144.

The cutting assembly 146 preferably consists of a replaceable cutting blade 148 mounted to the frame 106 with a small compression spring that allows the blade to shift to adjust for out of flatness tolerances in the substrate. It is seen that as the application head 100 is moved downward onto the work table 150, the floating head 122, already in contact with the substrate at the vacuum shoe 128, slides on the linear bearing of slide assembly 124. This allows the frame 106 to continue moving downward, thereby moving the cutting blade 148 downward until it cuts through the gasket strip on the substrate.

An optical sensor 154 is illustrated in FIG. 5 for signaling the controller when the gasket strip in the payoff spool 112 is depleted. The sensor 154 "looks" through the slotted opening 156 in the side of the spool.

A continuous length of gasket strip 114 on the payoff spool 112 is advanced past the guide idler rollers 138, 139, and take-up idler roller 142, to the vacuum shoe 128 as shown. The release backer 118 is peeled off the gasket strip 114 around the take-up roller 142 and re-wound onto the take-up spool 144.

The gasket strips are applied by the application head 100 onto a carrier 152, a suitable carrier being a piece of release-coated sheet material (e.g., siliconized polyester film) large enough to hold the particular gasket pattern being made. A vacuum work table 150 applies a vacuum through the table to hold the carrier firmly in place. Dowel pins or other alignment mechanism can be used to assure registry of the carrier.

The application process begins by orienting the application head 100 over a substrate in the desired position for a gasket strip to be applied. The lead end 158 of the strip is securely held by the vacuum applied in vacuum shoe 128. The lead end 158 is then applied to the carrier by simply moving the application head 100 downward until the gasket contacts the carrier 152, the gasket's adhesive side adhering to the carrier. The vacuum in the vacuum shoe 128 is then released, and replaced with pressurized air to assist in sliding the gasket strip over the shoe 128. The entire application head 100 is then moved in the desired horizontal direction to lay down the strip of gasket, it being understood that the application head 100 must be oriented properly as shown to lay down a gasket strip in a particular direction 159. As the application head 100 moves, the gasket strip already laid onto the carrier pulls additional gasket strip from the payoff spool 112, through the guide idler rollers, and onto the carrier 152. The take-up spool 144 collects the release backer 118 peeled away from the gasket material at take-up idler roller 142. After the desired length of material is laid on the carrier, the entire head 100 descends further to allow the blade 148 to cut the gasket strip. At the same time, the air pressure applied to the vacuum shoe 128 is shut off, and a vacuum is again drawn to secure the next lead end in the shoe. The application head 100 is next lifted from the carrier until the shoe 126 and gasket strip 114 clear the carrier 152 and the gasket strip is applied to the carrier. The head 100 is then repositioned at the next starting point to lay down another strip of gasket. This process is repeated until the gasket pattern is completed.

Figure 8:
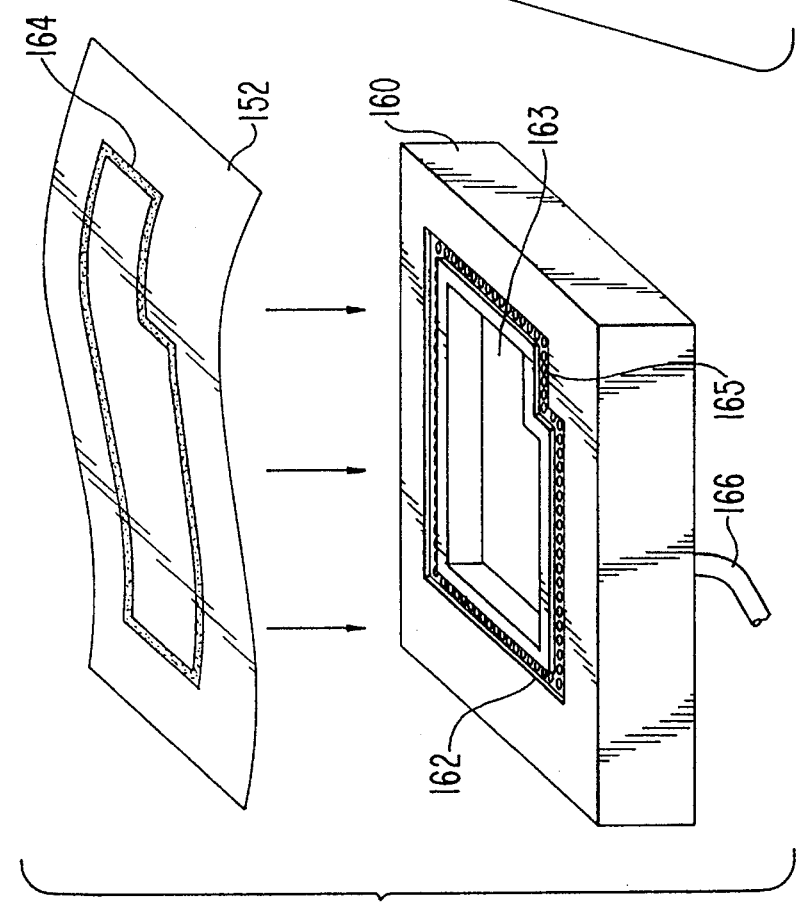
FIG. 8 is a perspective view showing how the gasket pattern created by the device of FIG. 5 is applied to a vacuum fixture.

Once the gasket is laid down on the carrier, it must be transferred onto the circuit board or shield cover. One method is shown in FIG. 8 utilizing a vacuum fixture 160. The vacuum fixture 160 can be a flat aluminum or plastic plate which has a channel configuration 162 to mate with gasket pattern 164 on carrier 152. The bottom of the channel 162 contains multiple small holes 165 connected via a plenum to a vacuum hose 166 through which a vacuum is drawn to hold the gasket securely in the channel.

The gasket is transferred by laying the carrier 152 onto the fixture 160 so that the gasket 164 lays in the channel 162. The vacuum in the channel 162 is applied, and the carrier 152 is peeled away from the gasket 164, exposing the gasket's adhesive. The circuit board, cover, or other substrate is then laid on top of the fixture 160, the vacuum to the channel 162 is removed, and the tenacious adhesive on the gasket strip 164 sticks to the substrate. The adhesive does not stick as aggressively to the carrier since the carrier 152 has a silicon release coating, permitting easy removal. This method is used primarily when there are components on the circuit board or cover where the surface area on the fixture 160 may be relieved or channelled to accommodate them as shown (e.g., recessed area 163). Registration holes can be used to align the gasket with the circuit board, cover, fixture, or other substrate.

Figure 9:
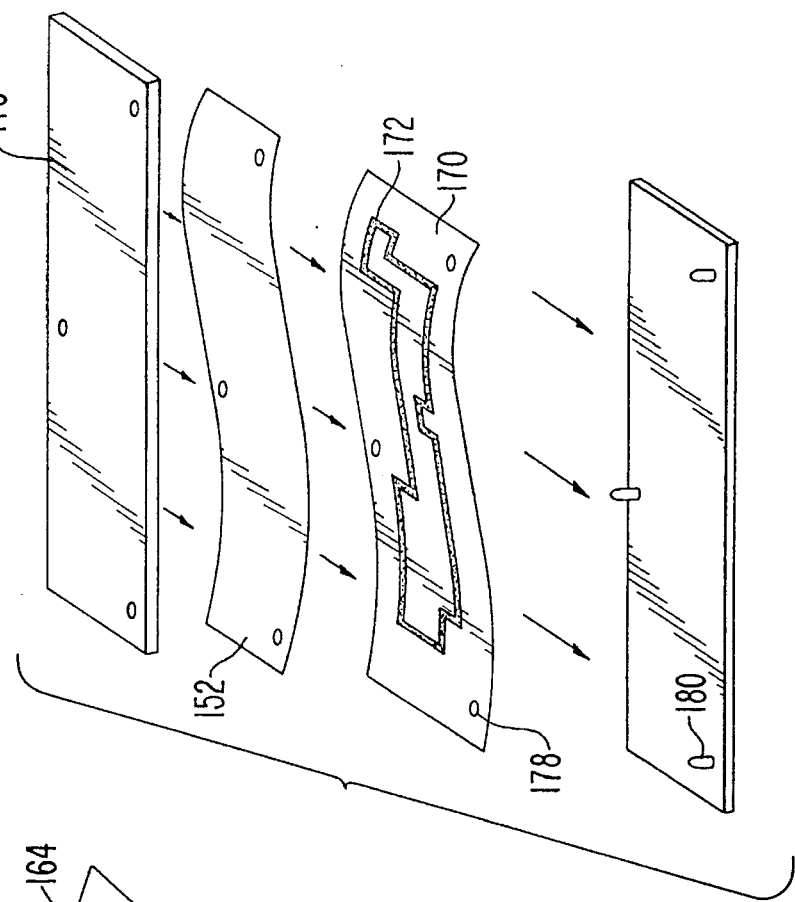
FIG. 9 is a perspective view showing the decal method of applying the gasket created by the device of FIG. 5 to a circuit board or cover.

As shown in FIG. 9, another method of transfer, referred to as the decal method, is preferred for its simplicity and cost-effectiveness. When the gasket is first produced on the carrier 152, a tacky-backer transfer sheet 170 is laid on top of gasket pattern 172, sandwiching the gasket 172 between the transfer sheet 170 and the carrier 152.

Because the transfer sheet 170 contains a tacky adhesive, the carrier 152 (with its silicon release coating) can be easily peeled away from the gasket 172 to expose the gasket adhesive. A cover or circuit board 176 is then pressed against the adhesive side of the gasket 152. Since the gasket adhesive is much more tenacious than the adhesive on the transfer paper 170, the transfer paper is easily peeled from the gasket 172, leaving only the gasket 172 on the cover 176 or circuit board. For registration purposes, punch-cut holes 178 in the transfer sheet 170 may be added to act as a reference guide for aligning with the cover or circuit board dowel pins 180 or other alignment device. The punch cut holes can be formed with a pneumatic punch cylinder mounted to the frame 106 or similar device. Another possible mounting method may comprise a decal method, such as that described in co-pending U.S. patent application Ser. No. 07/870,747 filed Apr. 10, 1992, incorporated by reference.

Figure 10:
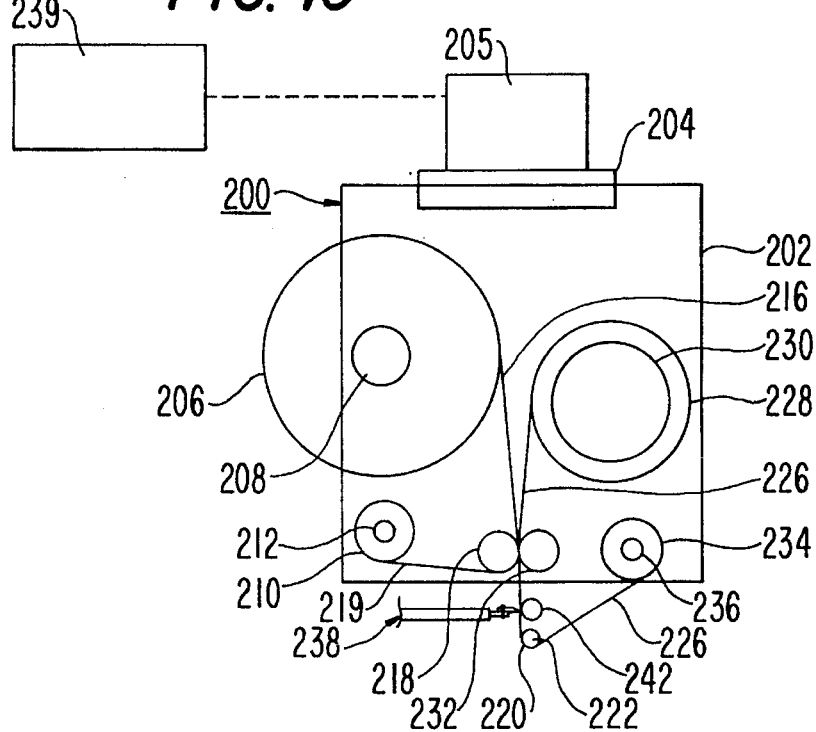
FIG. 10 is an elevational view of another gasket device for applying gasket strips directly to a circuit board.
Figure 11:
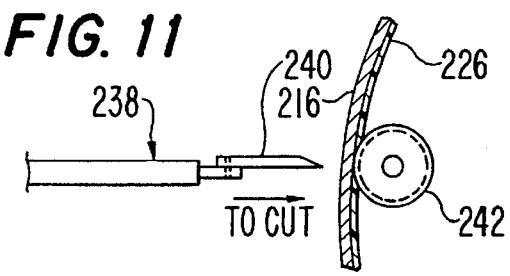
FIG. 11 is an enlarged view of the cutting assembly shown in FIG. 10.
Figure 12:
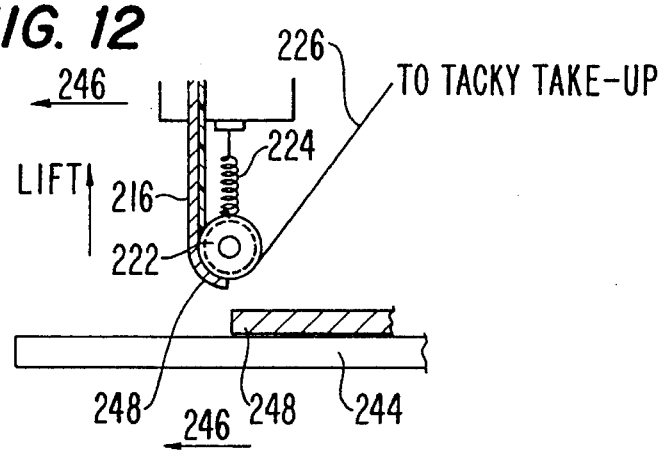
FIG. 12 is an enlarged view of the application shoe shown in FIG. 10.

A third embodiment, also for applying a gasket strip directly to a circuit board, is shown in FIGS. 10, 11 and 12. Similar in design and function to the first and second embodiments, it is readily understood when read in conjunction with the previously described embodiments.

An application head 200 has a frame 202, an adapter plate 204 to connect to a gantry 205, and a payoff spool 206 mounted on the hub 208. A take-up spool 210, mounted on hub 212, collects release backer 214 peeled from gasket strip 216 at take-up idler roller 218.

An application shoe 220 has a shouldered free-spinning idler roller 222 mounted with the compression spring 224 so that it may freely float up and down to absorb any out-of-flatness tolerances in the substrate, the substrate being a circuit board in this particular example.

The gasket strip 216 is pulled from the payoff spool 206 to the application idler roller 222 by a tacky backer strip 226. The tacky backer 226 is a strip of tape, such as conventional plastic adhesive tape, having a sticky side for adhering to the gasket strip 216. It is slit to a similar width as the gasket strip. A spool 228 of the tacky backer 226 is mounted on a tensioned hub 230. The sticky side of the tacky backer 226 is lightly pressed against the non-adhesive side of the gasket strip 216 through a combining mechanism, such as shouldered idler roller 218 and shouldered idler roller 232. It is seen that the idler roller 218 also acts as the take-up idler roller for the release backer 214 covering the adhesive side of the gasket strip. The release backer is removed after the tacky backer 226 is combined so that the adhesive side of the gasket strip does not stick to idler roller 218.

A tacky backer take-up spool 234, mounted on the hub 236, is driven by a motor, preferably a DC motor controlled by a variable voltage power supply, for applying enough torque to collect the tacky backer.

A cutting mechanism 238, operated by the controller 239, uses a pneumatic cylinder with replaceable blade 240 to cut the gasket strip 216 against a shouldered idler roller 242. The shouldered idler roller 242, having a shoulder depth equal to the thickness of the tacky backer 226, allows the gasket strip to be cut while leaving the tacky backer uncut. This cutting action may be performed several times, leaving different pre-cut length sections of gasket attached to the tacky backer as needed.

To apply the gasket strip to the substrate, the application head 200 is brought down until the application idler roller 222 presses the leading end 243 of the gasket strip onto the circuit board 244. The entire application head is then moved in the appropriate direction 246 to lay down the gasket strip. The advancing gasket strip creates slack in the tacky backer tape which is taken up by the motor driven take-up spool 234 as it peels away from the strip at the idler roller 222. The applied strip is ended by actuating the cutting mechanism 238 at the appropriate point of travel, and advancing the application head until the end of the strip 248 attaches to the substrate. The application head 200 is then lifted and repositioned to start its next run before new lead end 243 for the next strip application has made contact.

The present invention may be used to apply a wide variety of gasket materials. For example, electrically conductive gaskets (e.g., EMI gaskets), thermally conductive gaskets, environmental gaskets, chemically resistant gaskets, etc. Additionally, the gaskets may be held in place with a wide variety of adhesive materials, such as electrically and/or thermally conductive adhesives, thermo-set adhesives, pressure sensitive adhesives, etc.

It should be recognized that many other modifications of the present invention may be made. For example, the application head for the three embodiments described can be stationary, while the gantry controls the movement of the substrate relative to the application head to form the gasket pattern. It is also recognized that capstan drives may be incorporated to more accurately feed gasket material or drive the release or tacky backer materials.

It will be apparent to those skilled in the art that other modifications and variations can be made in the methods and apparatuses of the invention. The invention in its broader aspects, therefore, is not limited to the specific details and illustrated examples shown and described. Accordingly, changes and modifications may be incorporated and embodied within the scope of the appended claims.

What is claimed is:

1. A method of applying a gasket strip to a substrate, comprising the steps of:

(a) directing the movement of a robot with a controller;

(b) positioning a leading end of the gasket strip in relation to the substrate in preparation to begin applying the gasket strip to the substrate, said positioning done by moving said robot;

(c) bending the gasket strip in a predetermined direction;

(d) advancing a length of the gasket strip for positioning onto the substrate by peeling a release backer covering an adhesive side of the strip before the strip is applied to the substrate;

(e) guiding the advancing gasket strip applied onto the substrate with an application head;

(f) applying a vacuum to said application head to secure said leading end of the strip to said head when the strip is not being advanced, and removing said vacuum when the strip is being advanced; and (g) cutting the gasket strip to a predetermined length, said cutting actuated by the controller, wherein said bending biases the gasket strip to curve under an idler roller, in a predetermined direction, in preparation for a subsequent application.

2. A method of applying a gasket strip according to claim 1 further comprising the step of repeating steps (a), (b), (c), (d) and (e) to apply a plurality of gasket strips to the same substrate to form a gasket pattern.

3. A method of applying a gasket strip according to claim 1 further comprising the step of guiding the gasket strip from a payoff spool to said application head.

4. A method of applying a gasket strip according to claim 1, wherein said application head comprises an idler roller, and step (d) comprises the step of rolling the gasket strip onto the substrate with said idler roller.

5. A method of applying a gasket strip according to claim 1, wherein step (f) comprises the step of moving a cutting blade against an idler roller.

6. A method of applying a gasket strip according to claim 1, wherein step (f) comprises the step of moving a cutting blade against the substrate to cut the gasket strip after it is applied to the substrate.

7. A method of applying a gasket strip according to claim 1 further comprising the steps of:
providing apparatus for detecting the absence of the leading end of the gasket strip;
detecting the absence of said leading end of the gasket strip in a position for beginning the application of the gasket strip to the substrate; and
after detecting the absence of said leading end, advancing the gasket strip to move the leading end into position for application to the substrate.

8. An automated method of applying a gasket strip to a substrate, comprising the steps of:
(a) directing the movement of a robot with a controller;
(b) positioning a leading end of a first gasket strip onto the substrate to begin applying the strip to the substrate;
(c) bending the gasket strip in a predetermined direction;
(d) advancing the first gasket strip along a first predetermined path onto the substrate by peeling a release backer covering an adhesive side of the first gasket strip before the gasket strip is applied to the substrate;
(e) laying said advancing first gasket strip along said first predetermined path onto the substrate;
(f) cutting the gasket strip to a predetermined length, said cutting actuated by said controller, wherein said bending biases the gasket strip to curve under an idler roller, in a predetermined direction, in preparation for a subsequent application; and
(f) repeating steps (b), (c), (d), and (e) to apply a subsequent length of gasket strip along a second predetermined path on the substrate.

9. A method according to claim 8, wherein the application of said subsequent length of gasket strip is initiated by positioning said leading end of said subsequent length of the gasket strip adjacent an end of said first gasket strip.

10. An automated method of applying a gasket strip to a substrate, comprising the steps of:
(a) directing the movement of a robot with a controller;
(b) positioning a leading end of the gasket strip onto the substrate to begin applying the strip to the substrate;
(c) bending the gasket strip in a predetermined direction;
(d) applying a vacuum to an application shoe to secure the gasket strip to said shoe;
(e) positioning said leading end of the gasket strip onto the substrate to begin applying the gasket strip to the substrate;
(f) releasing the vacuum in the vacuum shoe, thereby releasing the gasket strip from said shoe;
(g) advancing a length of gasket strip for positioning onto the substrate by peeling a release backer covering an adhesive side of the strip before the gasket strip is applied to the substrate; and
(h) cutting the gasket strip to a predetermined length, said cutting actuated by said controller, wherein said bending biases the gasket strip to curve under an idler roller, in a predetermined direction, in preparation for a subsequent application.

11. An automated method of applying a gasket strip according to claim 10 further comprising the steps of:
guiding the gasket strip between a payoff spool and said application shoe; and
collecting said peeled release backer with a take-up spool.

12. An automated method of applying a gasket strip according to claim 10, wherein step (g) comprises the step of moving a blade through the gasket strip on the substrate.

13. An automated method of applying a gasket strip according to claim 10 further comprising the step of providing pressurized air to said application shoe to help the gasket strip slide past said shoe.

14. An apparatus for applying a strip of gasket material to a substrate, comprising:
a robot for controlling the position of the strip in relation to the substrate;
a controller for directing the movement of said robot;
an application head adapted to attach to said robot;
an application shoe attached to said application head for applying the strip to the substrate, the application shoe including a vacuum shoe adapted to connect to a vacuum source for selectably securing the gasket strip to the application shoe with a vacuum;
a roller which bends the strip in a predetermined direction to bias the strip in a ready position for a subsequent application;
a roller for peeling a release backer from an adhesive side of the strip, the peeling action by the roller advancing the strip for application to the substrate;
a guide for guiding the strip as it advances to said application shoe; and
a cutting mechanism attached to said application head for cutting the strip to a predetermined length, said cutting mechanism actuated by said controller.

15. An apparatus according to claim 14, wherein said application shoe comprises an idler roller for applying the gasket strip to the substrate.

16. An apparatus according to claim 14 further comprising:
a combining mechanism for combining a tacky backer with the strip; and
a peeling idler roller for peeling said tacky backer from the strip when the strip is being applied to the substrate.

17. An apparatus according to claim 14 wherein said cutting mechanism comprises:
a moveable blade actuated by said controller; and
a shouldered idler roller, said blade cutting the strip against said shouldered idler roller.

18. An apparatus according to claim 14 further comprising:
a hub for mountably supporting a payoff spool of gasket strip; and
a second hub for mountably supporting a take-up spool to collect said peeled release backer.

19. An apparatus according to claim 14, wherein said application head comprises:
a frame adapted to attach to said robot; and
a floating head, movably attached to said frame, wherein said application shoe is attached to said floating head.

20. An apparatus according to claim 19, wherein said floating head is movably attached to said frame by a slide assembly.

21. An apparatus according to claim 18, wherein said hub is tensioned to prevent free spinning of said spool of strip and said second hub is driven by a motor.

22. An application head for applying a gasket strip to a substrate and adapted for use with an automated apparatus having a robot and a controller, comprising:

a frame adapted to attach to the robot;

an application shoe attached to the application head for applying the strip to the substrate, said shoe comprising an application idler roller, the application shoe including a vacuum shoe adapted to connect to a vacuum source for selectably securing the gasket strip to the application shoe with a vacuum;

a roller which bends the strip in a predetermined direction to bias the strip in a ready position for a subsequent application;

a peeling idler roller attached to the application head for peeling a release backer from a side of the strip, the peeling advancing the strip for application to the substrate;

a first hub for holding a release backer take up spool that collects said peeled release backer; and a cutting assembly attached to said frame for cutting the strip to a predetermined length, said cutting mechanism actuated by the controller.

23. An application head according to claim 22 further comprising a second hub rotatably attached to said frame for holding a spool of gasket strip.

24. An application head according to claim 23 further comprising a floating head movably attached to said frame, wherein said application idler roller and said peeling idler roller are attached to said floating head.

25. An application head according to claim 23 wherein said second hub is tensioned to prevent free spinning.

26. An application head according to claim 22 further comprising a floating head movably attached to said frame to allow movement up and down relative to said frame, wherein said application and peeling idler rollers are attached to said floating head.

27. An application head according to claim 22 wherein said first hub is a motor driven hub.

28. An application head according to claim 27 wherein said motor is a direct current motor, the voltage thereto regulated by the controller.

29. An application head according to claim 27 wherein said motor is a stepper motor controlled by the controller.

30. An application head according to claim 22, wherein said cutting assembly comprises a blade actuated by the controller and a shouldered idler roller against which said blade cuts the gasket strip.

31. An application head according to claim 32 further comprising a sensor positioned to detect the presence of the gasket strip at said application idler roller.

32. An application head according to claim 32 further comprising an air nozzle for directing air to bias a lead end of the gasket strip under said application idler roller.

33. An application head according to claim 25 further comprising a spring connected between said floating head and said frame.

34. An application head for applying a gasket strip to a substrate, and adapted for use with a robot and a controller, comprising:

a frame adapted to attach to the robot;

a vacuum shoe attached to the application head for applying the strip to the substrate, said vacuum shoe adapted to connect to a vacuum source;

a roller which bends the strip in a predetermined direction to bias the strip in a ready position for a subsequent application;

a peeling idler roller attached to the application head for peeling a release backer from a side of the strip;

a first hub for holding a take up spool that collects the peeled release backer, the first hub providing a motive force for peeling the release backer, said motive force advancing the gasket strip; and a cutting assembly attached to said frame for cutting the strip, said cutting assembly activated by the controller.

35. An application head for applying a gasket strip according to claim 34 further comprising a second hub rotatably attached to the application head for holding a payoff spool of gasket strip.

36. An application head for applying a gasket strip according to claim 35 further comprising a floating head movably attached to said frame, and wherein said vacuum shoe is attached to said floating head.

37. An application head for applying a gasket strip according to claim 34, wherein said vacuum shoe has a channel in which the gasket strip can slide, and an opening connecting said channel to said vacuum source.

38. An application head for applying a gasket strip according to claim 36, wherein said cutting assembly comprises a blade fixed to said frame, said cutting assembly actuated by moving said frame toward the substrate until said blade cuts through the strip on the substrate.

39. An application head for applying a gasket strip according to claim 36 wherein said floating head is movably attached to said frame by a linear bearing.

40. An application head for applying a gasket strip according to claim 36 wherein said vacuum shoe has a channel in which the gasket strip can slide.

* * * * *